United States Patent
Nakagawa et al.

(10) Patent No.: US 7,077,901 B2
(45) Date of Patent: Jul. 18, 2006

(54) PROCESS FOR PRODUCING SINGLE CRYSTAL SILICON WAFERS

(75) Inventors: Katsumi Nakagawa, Kyoto (JP); Takao Yonehara, Kanagawa (JP); Kazuaki Ohmi, Kyoto (JP); Shoji Nishida, Nara (JP)

(73) Assignee: Canon Kabushiki Kaisha, Tokyo (JP)

( * ) Notice: Subject to any disclaimer, the term of this patent is extended or adjusted under 35 U.S.C. 154(b) by 313 days.

(21) Appl. No.: 10/402,214

(22) Filed: Mar. 31, 2003

(65) Prior Publication Data

US 2003/0183159 A1 Oct. 2, 2003

(30) Foreign Application Priority Data

Mar. 29, 2002 (JP) .............................. 2002-095995

(51) Int. Cl.
*C30B 19/02* (2006.01)
(52) U.S. Cl. .............................. 117/54; 117/56; 117/58; 117/63; 117/934
(58) Field of Classification Search ................... 117/54, 117/56, 58, 63, 934
See application file for complete search history.

(56) References Cited

U.S. PATENT DOCUMENTS

| | | | | |
|---|---|---|---|---|
| 4,584,073 A | | 4/1986 | Lahoda et al. | ........... 204/157.2 |
| 5,144,409 A | * | 9/1992 | Ma | .............................. 257/557 |
| 5,176,885 A | * | 1/1993 | Impink et al. | .................. 423/6 |
| 5,891,242 A | * | 4/1999 | Pesklak et al. | ................ 117/84 |
| 5,917,195 A | * | 6/1999 | Brown | ......................... 257/22 |
| 6,190,937 B1 | | 2/2001 | Nakagawa et al. | ........... 438/67 |
| 2003/0034505 A1 | * | 2/2003 | Stengel et al. | .............. 257/201 |

FOREIGN PATENT DOCUMENTS

JP 10-189924 7/1998

OTHER PUBLICATIONS

Capinski et al., "Thermal conductivity of isotopically enriched Si", Applied Physcis letters, vol. 71(15) Oct. 13, 1997 pp. 2109-2111.*

"Single-Isotope Silicon Helps Chips Keep Their Cool," *Max Plank Society, Research News Release* (May 10, 2000).

* cited by examiner

*Primary Examiner*—Robert Kunemund
(74) *Attorney, Agent, or Firm*—Fitzpatrick, Cella, Harper & Scinto

(57) ABSTRACT

A process for producing a single crystal silicon wafer, comprising the steps of forming a porous layer on a single crystal silicon substrate comprising a silicon whose concentration of mass number 28 silicon isotope is less than 92.5% on an average; dissolving a starting silicon whose concentration of mass number 28 silicone isotope whose mass number is more than 98% on an average in a melt for liquid-phase epitaxy until said starting silicon becomes to be a supersaturated state in said melt under reductive atmosphere maintained at high temperature: immersing said single crystal silicon substrate in said melt to grow a single crystal silicon layer on the surface of said porous layer of said single crystal silicon substrate; and peeling said single crystal silicon layer from a portion of said porous layer.

10 Claims, 3 Drawing Sheets

PROCESS FOR PRODUCING SINGLE CRYSTAL SILICON WAFERS

BACKGROUND OF THE INVENTION

1. Field of the Invention

The present invention relates to a process for producing a single crystal silicon wafer, particularly a highly thermally-conductive single crystal silicon wafer

2. Related Background Art

Computer performance has rapidly progressed in recent years. Particularly, the processing speed of computers has significantly improved primarily due to the use of microprocessors, which have a high operating frequency. However, the use of such microprocessors results in an increased electric power consumption. For instance, an Alpha 21264 chip produced by Compaq, which chip is presently used as the microprocessor, operates at a frequency of 600 MHz, which is quite high, resulting in a power consumption of 109 W, which is also quite high. Microprocessors with an even higher operating frequency have been developed. These semiconductor chips consume large amounts of electric power when they are operated at a high frequency, leading to a large increase in temperature. As the temperature increases, the mobility of electrons or holes is decreased, deteriorating the performance of the chip as the microprocessor. Also, a temperature increase, which is generally called a "hot spot", occurs causing critical damages.

In order to prevent these problems from occurring, there has been proposed a way to cool the semiconductor chip, which is used as the microprocessor. However, this not considered to always be a decisive solution. Thus, it is necessary to focus on the thermal conductivity inside the semiconductor chip in order to sufficiently solve the problem.

In the X-ray optical systems, a silicon single crystal has been used as a mirror in which Bragg reflection is utilized. In this technical field, strong X-ray sources, such a as synchrotron, have been developed and their use has started to predominate. In that connection, there has been developed a way of cooling the silicon single crystal so that the damage to the mirror due to heat is prevented even when it is subjected to strong radioactive rays.

Separately, in the field of the photovoltaic power generation, an optical-concentration type photovoltaic power generation system, in which a high performance solar cell fabricated using a silicon single crystal is arranged on a focal plane where the sunlight is concentrated to a magnitude of 10 to 500 times by means of an optical focusing system to generate power, has been spotlighted. In this photovoltaic power generation system, in principle, the photoelectric conversion efficiency is to be increased. However, if the solar cell is not sufficiently cooled, the advantage of increasing the photoelectric conversion efficiency by way of supplying highly concentrated light to the solar cell is reduced. Thus, attempts have been made to cool the solar cell in the optical-concentration type photovoltaic power generation system.

However, it is expected that not only the X-ray optical systems, but also the optical-concentration type photovoltaic power generation system will be more improved with respect to performance. In that case, it is presumed that the thermal conductivity of the inside of the silicon single crystal will become an important subject to be thoroughly considered.

Also, in view of this, extensive studies have been conducted in order to find semiconductor materials, which hardly generate any heat and whose characteristics do not easily deteriorate in such applications as described above, and which can replace the silicon semiconductor material used in various devices as described above. However, it is difficult to find an appropriate semiconductor material of this type, because even if it is accidentally discovered, it will be very expensive or harmful to the environment.

Besides, particularly in the case of a device such as a microprocessors, which is fabricated by a complicated process, when a prescribed semiconductor that is ordinarily used is changed to another semiconductor material, it is necessary to have another look at a series of the steps and the materials used in every step of the fabrication process, and this cannot be easily performed in practice.

In order to resolve this situation, U.S. Pat. No. 5,144,409 (hereinafter referred to as document 1) proposes a process of producing a semiconductor device using a silicon enriched with a silicon isotope whose mass number is 28 (that is, $^{28}Si$). Document 1 describes that in the naturally occurring form, silicon is primarily composed of three kinds of stable silicon isotopes, namely, 92.2% $^{28}Si$, 4.7% $^{29}Si$, and 3.1% $^{30}Si$. Although it is almost impossible to chemically identify these silicon isotopes, they are different from each other in terms of their mass number. Because of this difference, they influence the thermal oscillation of the atomic nucleus and increase the scattering of photons. Thus, the mixture composed of these three silicon isotopes has an inferior thermal conductivity. In this respect, it is understood that the gist of the technique described in document 1 is directed to improving the thermal conductivity by increasing the content of $^{28}Si$.

Research News Release of Max Plank Society (published May 10, 2000) (hereinafter referred to as document 2) indicates that at room temperature, an isotopically pure silicon crystal (enriched to 99.8588% $^{28}Si$) is a 60% better heat conductor than natural silicon, which consists of three kinds of stable silicon isotopes (92.2% $^{28}Si$, 4.7% $^{29}Si$, and 3.1% $^{30}Si$). Document 2 also indicates that the thermal conductivity of this silicon crystal is enhanced at a temperature that is lower than room temperature.

As the process to enrich a specific isotope element, U.S. Pat. No. 4,584,073 (hereinafter referred to as document 3) discloses a process for separating an isotope of an element from other isotopes of the element in a compound. In more detail, the process of document 3 comprises depositing this compound as a mono-layer on small glass beads, entraining the coated beads in a carrier gas containing a scavenger gas, exposing the entrained, coated beads to light from a laser that excites the one isotopic compound and causes it to react with the scavenger gas to form a reaction product while the other isotopic compounds remain stable, separating the other isotopic compounds from the reaction product and removing the reaction product from the beads to provide a desired isotope element.

U.S. Pat. No. 5,176,885 (hereinafter referred to as document 4) discloses a process for separating the lower molecular weight isotope fraction from the higher molecular weight isotope fraction of an element, which forms a water soluble acid at a temperature amenable to an ion exchange, where the separation is accomplished by shifting the equilibrium constants of absorption and desorption by temperature variations of the acidic solution. Document 4 also discloses that the process is preferably employed to enrich a boric acid solution in its boron-10 isotope fraction by employing ion exchange resins, which are capable of thermally storing and releasing boron isotopes.

In the case where it is intended to produce a silicon product enriched in $^{28}$Si in accordance with a technique as above described, the process becomes unavoidably complicated, because it is necessary for silicon isotopes, whose chemical properties are substantially the same, to be concentrated to separate the desired silicon isotope. This makes the product enriched with the silicon isotope whose mass number is 28 ($^{28}$Si) considerably expensive.

Now, in general, a single crystal silicon wafer is fabricated by a method wherein an ingot drawn up by the Czockralski method or the floating zone melting method is sliced and then subjected to abrasive polishing. In the case where a single crystal silicon wafer enriched with the $^{28}$Si isotope is fabricated by this method, a substantial amount of waste is generated during the slicing process and the surface-polishing process.

Separately, in recent years, there is a tendency to increase the size of a single crystal silicon wafer. Specifically, the diameter of 8 inches is the mainstream in the semiconductor production lines at the present time, and this diameter will be increased to 12 inches in the near future. In order to fabricate a single crystal silicon wafer having such a large diameter, it is necessary to draw up an ingot having a large diameter, using silicon enriched with $^{28}$Si, which is costly. This method is difficult to employ on an industrial scale mainly in view of the cost.

Therefore, there have been attempts to produce an epi-wafer by epitaxially growing silicon enriched with $^{28}$Si on an ordinary silicon wafer. This method has advantages in that the silicon material utilization efficiency is relatively high and the up-sizing is relatively easy. However, this method is disadvantageous in that because an ordinary silicon wafer whose thermal conductivity is low is used as a substrate. Thus, although this wafer would be effective in improving heat generation uniformity in the chip plane, sufficient improvement cannot be achieved in the heat conduction in the thickness direction.

A gas-phase growth method is often adopted in order to epitaxially grow silicon as described above. In the gas-phase growth method, epitaxial growth is performed by flowing a raw material gas of a silicon compound as silane gas or silicon chloride gas into a reaction vessel and thermally decomposing this raw material gas on a substrate comprising an ordinary silicon wafer arranged in the reaction vessel while being maintained at a high temperature, where a considerable part of the raw material gas is exhausted without being grown on the substrate. In this case, in order to produce an epi-wafer, it is necessary to use a raw material gas of a silicon compound enriched with a particular silicon isotope, which is costly. Also, since a considerable portion of this highly expensive raw material gas introduced into the reaction vessel is exhausted without being used, the epi-wafer produced unavoidable becomes very expensive.

In view of this, it is very advantageous to adopt the liquid-phase growth method as the epitaxial growth method. The liquid-phase growth method is generally performed in the following manner. That is, a metal whose melting point is relatively low, such as indium (In), tin (Sn), gallium (Ga), aluminum (Al) or copper (Cu), is introduced into a crucible where the metal is fused into a liquid as a melt. Thereafter, silicon is dissolved in the melt produced in the crucible until this silicon is saturated in the melt. Then, while supersaturating the silicon dissolved in the melt, for instance, by a method of gradually cooling the melt, a base substrate is immersed in the melt, where the supersaturated silicon is deposited on and is grown on the substrate. In this liquid growth method, only a specific portion of silicon grown on the substrate is taken outside together with the substrate, generating no waste.

However, even in this case, as well as in the case of the gas-phase growth method, a silicon material enriched with a given silicon isotope, which is costly, cannot be used as the substrate in practice. Therefore, it is difficult to make full use of the advantage that the thermal conductivity of an epitaxially grown silicon is sufficiently high.

In this connection, there can be considered a method in which an epi-wafer having an epitaxial layer comprising silicon enriched with a given silicon isotope is provided, and the wafer is ground from the back side until a desired thickness is obtained while leaving the epitaxial layer, which can be achieved by chemical and mechanical grinding or the like. However, in this case, unless the thickness of about 30 µm of the wafer is left, the handling thereof in the following process becomes difficult. In the fabrication of a microprocessor or the like, it will be sufficient for the epitaxial layer to have a thickness of about 10 µm. Nevertheless, this grinding method is insufficient in terms of the cost reduction and also in terms of the improvement of the thermal conductivity.

SUMMARY OF THE INVENTION

The present invention has been accomplished as a result of extensive studies by the present inventors in order to solve the foregoing problems in the prior art.

The present invention makes it an object to provide a process for producing a single crystal silicon wafer, which enables one to efficiently produce a single crystal silicon wafer having a large size and improved thermal conductivity.

Another object of the present invention is to provide a process for producing a single crystal silicon wafer, which enables one to efficiently produce a single crystal silicon wafer whose thickness is desirably thin and which has a large size and sufficient thermal conductivity by effectively using a silicon raw material containing concentrated silicon isotope which is costly without wasting it.

The process of the present invention is for producing a single crystal silicon wafer comprising a silicon enriched in silicon isotope whose mass number is 28 (hereinafter referred to as $^{28}$Si) to an average concentration of more than 98%, said process typically comprising:

a step (i) wherein a porous layer is formed on a single crystal silicon substrate comprising a silicon whose concentration of $^{28}$Si is less than 92.5% on an average:

a step (ii) wherein a starting silicon material whose concentration of $^{28}$Si is more than 98% on an average is dissolved in a melt for liquid-phase epitaxy until said starting silicon material becomes to be a supersaturated state in said melt under reductive atmosphere maintained at high temperature;

a step (iii) wherein said single crystal silicon substrate is immersed in said melt to grow a single crystal silicon layer on the surface of said porous layer of said single crystal silicon substrate; and a step (iv) wherein said single crystal silicon layer grown on said porous layer of said single crystal silicon substrate in said step (iii) is made to be a wafer and said wafer is peeled from a portion of said porous layer.

As the single crystal silicon substrate used in the step (i) for forming the porous layer thereon, it is preferred to use one whose orientation is (111).

The single crystal silicon substrate used in the step (i) for forming the porous layer thereon is preferred to have a shape in a rectangular form.

In the step (ii) wherein the starting silicon material is dissolved in the melt until said starting silicon material becomes to be a supersaturated state in the melt, it is possible that as the starting silicon material, a gaseous sililcon compound whose concentration of $^{28}$Si is more than 98% is dissolved in the melt.

In the step (iii) wherein the single crystal silicon layer is grown on the surface of the porous layer of the single crystal silicon substrate, it is preferred that said single crystal silicon layer is grown at a thickness of less than 100 μm on the surface of said porous layer.

Between the step (iii) wherein the single crystal silicon layer is grown on the surface of the porous layer of the single crystal silicon substrate and the step (iv) wherein the single crystal silicon layer grown on the surface of the porous layer is peeled from tho portion of the porous layer, it is possible to have a step wherein at least a semiconductor junction is formed at the single crystal silicon layer grown on the surface of the porous layer.

Further, between the step (iii) wherein the single crystal silicon layer is grown on the surface of the porous layer of the single crystal silicon substrate and the step (iv) wherein the single crystal silicon layer grown on the surface of the porous layer is peeled from the portion of the porous layer, it is possible to have a stop wherein a silicon oxide layer is at least formed on the surface of the single crystal silicon layer grown on the surface of the porous layer.

The step (iv) wherein the single crystal silicon layer grown on the surface of the porous layer is peeled from the portion of the porous layer of the single crystal silicon substrate may be performed by a manner wherein a substrate is laminated on the surface of the single crystal silicon layer grown on the surface of the porous layer of the single crystal silicon substrate and a force is worked between said substrate laminated on the single crystal silicon layer and the single crystal silicon substrate to peel the single crystal silicon layer from the portion of the porous layer.

Alternatively, the step (iv) wherein the single crystal silicon layer grown on the surface of the porous layer is peeled from the portion of the porous layer of the single crystal silicon substrate may be performed by a manner wherein a temperature gradient is rapidly afforded between the surface of the single crystal silicon layer and the rear face of the single crystal silicon substrate and by virtue of a shearing force provided due to a difference between the thermal expansion magnitude of the former and that of the latter, whereby the single crystal silicon layer is peeled from the portion of the porous layer.

After the step (iv) wherein the single crystal silicon layer is peeled from the portion of the porous layer, it is preferred to have a step wherein the surface of the single crystal silicon substrate is flattened, followed by being recycled.

Other features and advantages of the present invention will be apparent from the following description taken in conjunction with the accompanying drawings.

BRIEF DESCRIPTION OF THE DRAWINGS

FIGS. 3(a) through 2(g) are schematic diagrams for explaining an embodiment when the production process of the present invention is applied to produce a solar cell for use in an optical-concentration type photovoltaic power generation system.

DETAILED DESCRIPTION OF PREFERRED EMBODIMENTS

In the following, preferred embodiments of the present invention will be detailed with reference to the drawings. It should be understood that the present invention is not restricted by these embodiments.

FIGS. 1(a) through 1(g) are schematic diagrams for explaining an embodiment when the production process of the present invention is applied to produce a single crystal silicon wafer having high thermal conductivity. Particularly, FIGS. 1(a) through 1(g) stepwise show the production process of the present invention when said single crystal silicon wafer is produced.

Figure 1A:
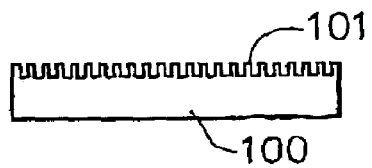
FIGS. 1(a) through 1(g) are schematic diagrams for explaining an embodiment when the production process of the present invention is applied to produce a single crystal silicon wafer having high thermal conductivity.

In FIG. 1(a), reference numeral 101 indicates a single crystal silicon substrate fabricated from a starting silicon material in which no silicon isotope is concentrated, naturally composed of three kinds of stable silicon isotopes, namely, 92.2% $^{28}$Si, 4.7% $^{29}$Si, and 3.1% $^{30}$Si. The concentrations of these three silicon isotopes will be occasionally varied depending on a purification method of the impurities.

The single crystal silicon substrate 101 is not always necessary to be shaped in a round form. It may be shaped in a rectangular form.

On the surface of the single crystal silicon substrate 101, a porous layer 101 provided with a number of minute pores having a size of several hundreds angstroms is formed by the electrochemical method which is the so-called anodizing method. In the anodization of a surface region of the single crystal silicon substrate 100 to form the porous layer 101, it is convenient if the single crystal silicon substrate 100 comprises a p-type silicon whose resistance is low such that the resistivity is in a range of from 0.01 to 0.1 Ωcm. However, when a means to irradiate light or the like is together used upon the anodization, it is possible for the single crystal silicon substrate 100 to comprise a silicon whose resistance is relatively high such as an n-type silicon.

For the orientation of the single crystal silicon substrate 100, (100) is the most general. However, it may be desirably (111). Particularly in the case where it is intended to produce a thin wafer having a thickness of less than 100 μm, the single crystal silicon substrate whose orientation is (111) and which has a strong strength is more advantageous because it is difficult to suffer from cracking in the production process of a device and the yield is heightened. In the past, a wafer whose orientation is (111) had refrained from using for the reason that many levels would be present at the interface with an oxide layer formed thereon. However, in recent years, it has been reported that this situation could be drastically improved by utilizing plasma in the formation of said oxide layer so that said wafer can be used in the production of ordinary devices, and this has been spotlighted (see, Tadahiro Ohmi et als., *Nikkei Microdevice*, published August 2000, pp. 213–220).

And, in the case where epitaxial growth is performed by the liquid-phase growth method on the porous layer 101, when the single crystal silicon substrate whose orientation is (111) is used, the surface after the epitaxial growth is likely to be desirably flattened and therefore, it is advantageous to use said substrate as a wafer used in the production of ICs including microprocessor.

Figure 1B:
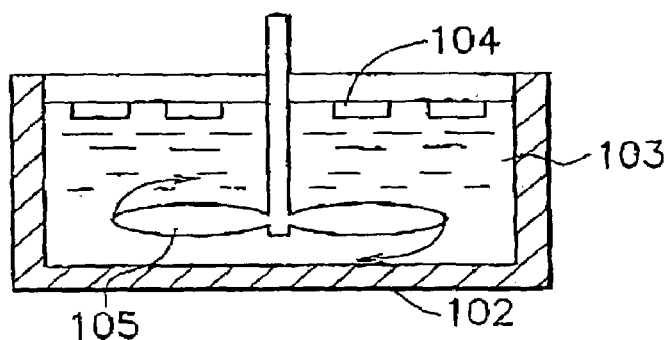

In the step shown in FIG. 1(b), a metal whose melting point is relatively low such as indium (In), tin (Sn), gallium (Ga), aluminum (Al), or copper (Cu) is accommodated in a crucible 102 made of quartz glass or carbon. The metal accommodated in the crucible 102 is heated and fused. A starting silicon 104 enriched in silicon isotope whose mass number is 28 (that is, $^{28}$Si) is put into the fused metal in the crucible 102. As the time elapses, the silicon 104 is dissolved in the fused metal in the crucible 102 until it is saturated in the fused metal whereby a melt 103 is produced. At this time, in order to sufficiently dissolve the silicon 104 in the fused metal, it is preferred to agitate the fused metal by an agitation means 105 upon dissolving the silicon in the fused metal. And when the melt 103 has a locally high silicon concentration portion which therefore has a low density, said portion is liable to stay in the vicinity of the surface of the melt 103, and therefore, it is preferred to agitate the melt 103 by the agitation means in order to make the melt have an uniform concentration.

By the way, it is possible that the concentration of the silicon isotope whose mass number is 28 in the starting silicon is increased to exceed 98%. When the concentration of the silicon isotope is increased up to this order, the effect to improve the thermal conductivity is significantly appeared. Separately, the increase of the concentration of the silicon isotope is performed in the form of gas such as $Si_2F_6$ or the like. Therefore, instead of supplying the starting silicon in the form of a solid such as a polycrystal or the like, to adopt a method wherein a prescribed gaseous silicon compound (whose concentration of $^{28}$Si is more than 98% on an average) is blown into the melt and decomposed with the heat of the melt is more efficient.

Figure 1C:
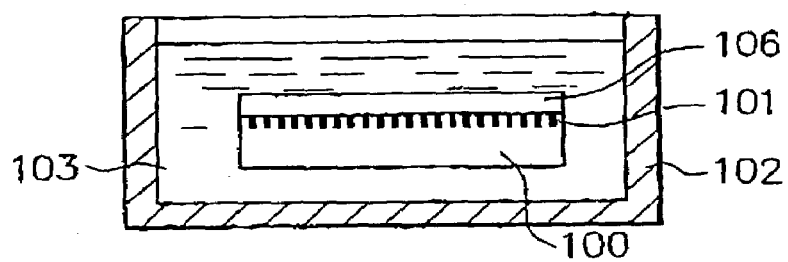

In the step shown in FIG. 1(c), after the melt 103 saturated with the silicon in the step shown in FIG. 1(b) is gradually cooled until the melt becomes to have a prescribed, supersaturated degree, the single crystal silicon substrate 100 having the porous layer 101 thereon which is provided in the step shown in FIG. 1(a) is immersed in the melt 103, where a single crystal silicon layer 106 having a high concentration of silicon isotope whose mass number is 28 starts growing on the surface of the porous layer 101. Although the porous layer 101 is provided with a number of minute pores, the porous layer still maintains the property as the single crystal, and the epitaxial growth is desirably occurred thereon.

By continuing the cooling of the melt 103, when the single crystal silicon layer 106 is grown at a desired thickness, the single crystal silicon substrate 100 is pulled up from the melt 103. Specifically, it is preferred that the single crystal silicon layer 106 is grown at a thickness of less than 100 μm. The concentration of the silicon isotope whose mass number is 28 substantially corresponds to that of the starting silicon used in the step shown in FIG. 1(b).

FIG. 1(c) is described such that nothing is grown on the rear face and the end face of the single crystal silicon substrate 100. In order to do in this ways it is necessary that the rear face and the end face of the single crystal silicon substrate 100 is covered by a masking member made of quartz glass or the like (not shown in the figure) or a silicon oxide layer (not shown in the figure) is formed on the rear face of the single crystal silicon substrate 100.

Other than the case where the liquid-phase growth method is performed by the gradually cooling method described in this embodiment, the liquid-phase growth method may be performed by the so-called temperature difference method wherein a silicon-saturated concentration distribution based on a temperature difference is made so as to be afforded in the melt and from the starting silicon is relatively maintained at high temperature, the silicon atoms are diffused to the single crystal silicon substrate which is relatively maintained at low temperature.

Figure 1D:
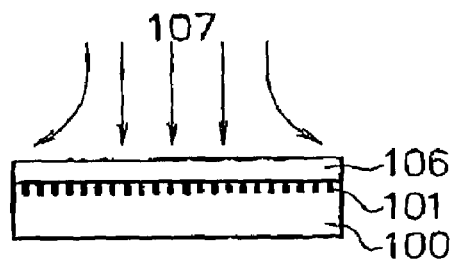

In the step shown in FIG. 1(d), a temperature gradient is applied to the single crystal silicon substrate 100 having the single crystal layer 106 grown thereon so that the single crystal layer 106 side suddenly becomes to be low temperature and it is maintained at this temperature. Specifically, for instance, this may be performed by a manner wherein the single crystal silicon substrate 100 firmly fixed to a treatment stage having a temperature controlling function and cold air 107 whose temperature is less than −10° C. is sprayed to the single crystal silicon layer 106 side.

In this case, since the thermal conductivity of the porous layer 101 is relatively lower because it has a number of minute pores and the thermal conductivity of the single crystal silicon layer 106 having a high concentration of the silicon isotope whose mass number is 28 is high is relatively higher, the single crystal silicon substrate 100 is quickly cooled from the single crystal silicon layer 106 side, only the single crystal silicon layer 106 is quickly cooled and contracted, where shearing stress is generated at the interface with the single crystal silicon substrate 100, whereby the porous layer 101 whose strength is inferior because of the minute pores present therein is destroyed and the single crystal silicon layer 106 is peeled from the porous layer 101.

To peel the single crystal silicon layer 106 may be also performed by such a manner as described, for instance, in Japanese Laid-open Patent Publication Hei.10(1998)-189924, wherein a substrate is bonded to the surface of the single crystal silicon layer 106 with the use of an adhesive or the like in advance and a force is applied to destroy the porous layer 101.

Figure 1E:
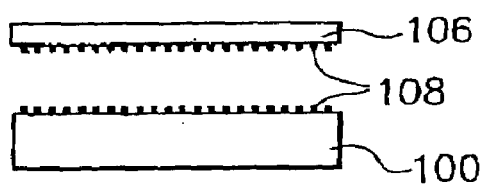

After the single crystal silicon layer 106 is peeled as above described, as shown in FIG. 1(e), residues 108 of the porous layer is left at the single crystal silicon substrate 100 and also at the single crystal silicon layer 106.

The porous layer residues 108 may be desirably removed by a simple manner of etching the residue with a hydrofluoric acid solution containing an oxidant such as nitric acid or an alkali solution. The surface after the porous layer residues 108 are removed may be more flattened by subjecting the surface to an annealing treatment in a hydrogen gas atmosphere maintained at a temperature of more than 1000° C.

Figure 1F:
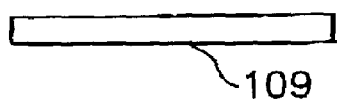

As shown in FIG. 1(f), the single crystal silicon layer 106 obtained by peeling from the portion of the porous layer 101 and removing the porous layer residues 108 becomes to be a single crystal silicon wafer 109 whose surface is flat and which has a desired thickness.

As will be understood from a the above description, the production process of the present invention enables one to efficiently produce a desirable single crystal silicon wafer enriched in silicon isotope whose mass number is 28 and which has satisfactory thermal conductivity substantially without wasting a starting silicon having a high concentration of silicon isotope whose mass number is 28, which is costly.

Figure 1G:

FIG. 1(g) shows the single crystal silicon substrate 100 after the porous layer residue 108 is removed. This single crystal silicon substrate may be recycled in the step shown in FIG. 1(a).

In FIGS. 1(a) through 1(g), for better understanding, particularly the porous layer 101 is drawn to have an extremely large thickness. In practice, the thickness of the porous layer 101 is in a range of from 5 to 10 µm. Separately, when the thickness of the single crystal silicon is about 600 µm, it may be repeatedly used several tens times or more. This contributes to diminishing the production cost of a single crystal silicon wafer obtained.

According to this embodiment explained in the above with reference to FIGS. 1(a) through 1(g) for the production of a single crystal silicon wafer, it is understood that in spite of using an ordinary single crystal silicon substrate which is relatively inexpensive, it is possible to efficiently produce a desirable single crystal silicon wafer enriched in silicon isotope whose mass number is 28 and which has satisfactory thermal conductivity by way of forming an epitaxial layer comprising a silicon enriched in prescribed silicon isotope on said substrate by the liquid-phase growth method and peeling said epitaxial layer from the substrate.

Now, in this embodiment, if necessary, it is possible to laminate a support substrate having high thermal conductivity on the single crystal silicon layer 106 as the epitaxial layer between the step shown in FIG. 1(b) and the step shown in FIG. 1(d). And it is possible that the support substrate is maintained as it is at the time of peeling the single crystal silicon layer, and after the single crystal silicon layer is peeled, the support substrate is removed from the single crystal silicon layer to make the single crystal silicon layer to be a standing single crystal silicon wafer.

As described in the above, not only in the epitaxitially growing step but also in the step of peeling the epitaxial layer (the single crystal silicon layer) from the substrate (the single crystal silicon substrate), there is substantially no such an occasion that the starting silicon whose concentration of the prescribed silicon isotope is high and which is costly is wasted. In addition, since the the epitaxial layer (the single crystal silicon layer) can be formed at a necessary and minimum thickness and thereafter, the single crystal silicon substrate (comprising an ordinary single crystal silicon wafer) whose thermal conductivity is low can be removed. Therefore, in parallel with the condensation effect of the prescribed silicone isotope, it is possible to produce a desirable single crystal silicon water whose thermal conductivity has been raised until the utmost limit.

Further, a single crystal silicon substrate comprising a silicon whose concentration of silicon isotope having a mass number of 28 is less than 92.5% which is used as the single crystal silicon substrate in the present invention can be easily acquired at a relatively inexpensive cost. This makes the present invention to provide an advantage to reduce the production cost of a product In the following, the present invention will be described in more detail with reference to the following examples. It should be understood that these examples are only for the illustrative purposes and the scope of the present invention is not restricted by these examples.

EXAMPLE 1

This example describes an embodiment or the production process of the present invention when it is applied in the production of a thin type single crystal silicon wafer using an isotope-enriched silicon as the starting silicon, which is suitable for use in the production of a microprocessor which operates with a high operating frequency or the like.

EXAMPLE 1A

Aforesaid thin type single crystal silicon wafer was produced in accordance with the production process shown in FIGS. 1(a) through 1(g) as will be described below.

As the single crystal silicon substrate 100, there was provided a single crystal silicon wafer fabricated from a starting silicon in which no silicon isotope is concentrated, composed of three kinds of stable silicon isotopes, namely, 92.4% $^{28}$Si., 4.6% $^{29}$Si, and 3.0% $^{30}$Si. This single crystal silicon wafer is of orientation (111) and has a diameter of 8 inches. The resistivity of this single crystal silicon wafer was found to be 0.2 Ωcm.

On the surface of the single crystal silicon substrate 100, there was formed a porous layer 101 by the anodizing method. In a mixed solution obtained by mixing hydrofluoric acid and isopropyl alcohol at a mixing ratio of 1:1, the single crystal silicon substrate 100 and a platinum electrode plate were immersed such that they were opposed to each other while having an interval of 5 cm between them. Then, the single crystal silicon substrate 100 was made to serve as a positive electrode, and a direct current voltage was applied thereto. Particularly, electric current of 6 A was flown between the two electrode for the beginning 10 minutes, followed by flowing electric current of 15 A for 2 minutes. By this operation, a porous layer 101 comprising a first porous layer region provided with a number of pores having a relatively small size which extends from the surface of the single crystal silicon substrate 100 to a 10 µm depth thereof and a successive second porous layer region provided with a number of pores having a relatively large size which follows the first porous layer region was formed. In this way, the single crystal silicon substrate 100 was made have the porous layer 101 thereon.

The rear face and the circumference of the single crystal silicon substrate 100 were covered by a masking member made of quartz glass in order to prevent silicon from being grown on these areas.

Separately, as shown in FIG. 1(b), in the crucible 102 (made of quartz glass) arranged in a growth furnace (not shown in the figure) structured so that the inside thereof can be kept in an airtight state, indium (In) was introduced, and the indium accommodated in the crucible was heated to 900° C., whereby the indium was fused to produce a melt 103 in the crucible. Then, 10.0 g of pellets of silicon enriched in silicon isotope having mass number of 28 to 98.3% was dissolved in the melt 103, followed by being saturated. At this time, the melt 103 was agitated by means of the agitation means 105.

After this, the temperature of the melt 103 was gradually decreased, and when the temperature of the melt became to be 890° C., as shown in FIG. 1(c), the foregoing single crystal silicon substrate 100 having the porous layer 101 thereon was immersed in the melt 103. While maintaining this state, the temperature of the melt 103 was gradually decreased, and when the temperature of the melt 103 became to be 850° C., the single crystal silicon substrate 100 was pulled up and taken out outside the growth furnace.

The masking member was removed from the single crystal silicon substrate 100, and the single crystal silicon substrate 100 was examined. As a result, it was found that a single crystal silicon layer 106 was beautifully grown only on the surface of the porous layer 101 without the melt 103 being adhered on the single crystal silicon substrate 100. It was also found that the melt 103 was not adhered on the surface of the masking member.

Separately, it was found that the weight of the single crystal silicon substrate 100 after the liquid-phase epitaxy was increased by 2.0 g in comparison with that before the liquid-phase epitaxy. This means that 2.0 g of the silicon in the melt was grown on the single crystal silicon substrate 100 in the liquid-phase epitaxy.

In addition, the grown single crystal silicon layer 106 was examined. As a result, it was found that the single crystal silicon layer 106 was enriched in silicon isotope having a mass number of 28 to 98.2%, which is substantially the same as the starting silicon.

Then, the single crystal silicon substrate 100 (having the single crystal silicon layer 106 grown on the surface of the porous layer 101 of the substrate 100) was firmly vacuum-chucked onto the surface of a treatment stage having a temperature controlling function (not shown in the figure) such that the rear face of the substrate 100 was faced to the surface of the treatment stage, the surface of the treatment stage being controlled to have a surface temperature of 25° C., where as shown in FIG. 1(d), cold air 107 comprising dried nitrogen gas whose temperature is −10° C. was sprayed from above the single crystal silicon layer 106 of the substrate 100. The spraying of the cold air was performed for about 15 seconds.

As a result, the single crystal silicon layer 106 was peeled from the single crystal silicon substrate 100, as shown in FIG. 1(e).

The single crystal silicon layer 106 was examined. As a result, defects such as cracking and the like were not observed in the single crystal silicon layer 106. It was also found that the front surface of the single crystal silicon layer 106 on the side opposite to the single crystal silicon substrate 100 was an utterly brilliant surface but the rear face thereof had residues 108 of the porous layer thereon.

Therefore, the rear face of the single crystal silicon layer 106 was subjected to an etching treatment in the following manner, in order to remove said porous layer residues 108 remained on the rear face. That is, the single crystal silicon layer 106 was placed on a duckboard comprising a number of thin bar-like members which is arranged on the bottom of a flat bottom vessel made of Pyrex glass (trademark name) and having a drain port, such that the rear face of the single crystal silicon layer 106 was faced above, where an organic alkali solution was gently poured to said rear face from above.

After the porous layer residues 108 were etched off and the rear face of the single crystal silicon layer 106 became to exhibit brilliantness of the silicon, the pouring of the organic alkali solution was terminated and the organic alkali solution was discharged to the outside through the drain port of the vessel. Following this, while the drain port of the vessel being opened, pure water was continuously flown into the vessel to rinse the single crystal silicon layer 106.

After the single crystal sililcon layer 106 was rinsed with the pure water in this way, the introduction of the pure water was terminated, and the single crystal silicon layer 106 was taken out from the vessel, followed by subjecting to air-drying. Successively, the single crystal silicon layer 106 was placed in an annealing furnace, where the single crystal silicon layer 106 was subjected to an annealing treatment in a hydrogen gas atmosphere maintained at a temperature of 1100° C.

The single crystal silicon layer 106 thus treated was examined by means of a microscope. As a result, it was found that each of the front face and the rear face of the single crystal silicon layer 106 was an uniformly flat face with no defect.

Thus, there was obtained a single crystal silicon wafer 109 as shown in FIG. 1(f), which is enriched in silicon isotope having a mass number of 28 and has a thickness of 30 μm and a diameter of 8 inches. The thermal conductivity of this single crystal silicon wafer 109 was found to be 245 W/m·deg.

Now, the single crystal silicon substrate 100 remained in the above was also found to have residues 108 of the porous layer. Therefore, as well as in the case of the single crystal silicon layer 106, the single crystal silicon substrate 100 was subjected to the etching treatment using the organic alkali solution to remove the porous layer residue 108, followed by subjecting to the annealing treatment using the hydrogen gas, whereby the opposite faces of the single crystal silicon substrate 100 were respectively uniformly flattened. Thus, there was obtained a resuscitated single crystal silicon substrate 100 as shown in FIG. 1(g).

EXAMPLE 1B

The resuscitated single crystal silicon substrate 100 obtained in Example 1A was recycled to the step of FIG. 1(a), a porous layer 101 was formed on the surface of the single crystal silicon substrate 100 in accordance with the previously described manner.

Separately, the melt 103 in the crucible 102 [see, FIG. 1(b)] whose silicon concentration had been reduced due to the first liquid-phase epitaxy was again heated to 900° C., and pellets of silicon enriched in silicon isotope having mass number of 28 to 98.3% were put in the melt, where at the time when 2.1 g of the silicon pellets was dissolved, the melt was saturated. This means that 2.1 g of the silicon was consumed in the first liquid-phase epitaxy. And as previously described, 2.0 g of the silicon in the melt was grown on the single crystal silicon substrate 100 in the first liquid-phase epitaxy. Thus it is understood that the starting silicon was utilized in the formation of the single crystal silicon layer 106 substantially without wasting the starting silicon. It can be said that the utilization efficiency of the starting silicon is about 95%.

Except that the foregoing resuscitated single crystal silicon substrate 100 having the porous layer 101 formed thereon was immersed in the above melt 103, following the procedures for the production of the single crystal silicon wafer 109, described in Example 1A, there was produced a second single crystal silicon wafer 109 which is enriched in silicon isotope having a mass number of 28 and has a thickness of 30 μm and a diameter of 8 inches.

The thermal conductivity of this single crystal silicon wafer 109 was found to be 245 W/m·deg, as well as in Example 1A.

COMPARATIVE EXAMPLE 1

In this comparative example, the procedures of Example 1A were repeated, except for the following point, to obtain a single crystal silicon wafer having a thickness of 30 μm and a diameter of 8 inches.

That is, instead of the pellets of silicon enriched in silicon isotope having mass number of 28 to 98.3% used in Example 1A as the starting silicon, pellets of ordinary silicon in which no silicon isotope is concentrated, specifically, consisting of three kinds of stable silicon isotopes (92.2% $^{28}Si$, 4.7% $^{29}Si$, and 3.1% $^{30}Si$), were used.

The thermal conductivity of this single crystal silicon wafer was found to be 152 W/m·deg, which is markedly inferior to the thermal conductivity 245 W/m·deg of the single crystal silicon wafer obtained in Example 1A.

EXAMPLE 2

This example describes an embodiment of the production process of the present invention when it is applied in the formation of an epitaxial layer (that is, a single crystal silicon layer) comprising an isotope-enriched silicon and in the production a SOI wafer. Said epitaxial layer and said SOI wafer are suitable for use in the production of a microprocessor which operates with a high operating frequency or the like.

1. Formation of Epitaxial Layer:

An epitaxial layer (a single crystal silicon layer) was formed in accordance with the procedures until the step of FIG. 1(c) for the formation of the single crystal silicon layer 106 in Example 1A, except for the following point.

That is, in the step of FIG. 1(c), the single crystal silicon substrate 100 having the porous layer 101 formed thereon was immersed in the melt 103 of 890° C., followed by gradually decreasing the temperature of the melt 103, and when the temperature of the melt 103 became to be 885° C., the single crystal silicon substrate 100 was pulled up and taken out outside the growth furnace. And the masking member was removed from the single crystal silicon substrate 100. As a result, it was found that a single crystal silicon layer 106 was grown at a thickness of 5 μm on the surface of the porous layer 101 of the single crystal silicon substrate 100. The single crystal silicon substrate 100 having the single crystal silicon layer 106 formed on the porous layer of the substrate 100 will be hereinafter referred to as "laminate".

2. Production of SOI Wafer:

A thin diamond layer 201 having a thickness of 1 μm was formed so as to coat a surface of a molybdenum plate 200 by means of sputtering in a hydrogen gas atmosphere. The molybdenum plate 200 whose surface is coated by the thin diamond layer 201 was used as a support substrate in the following.

Figure 2A:
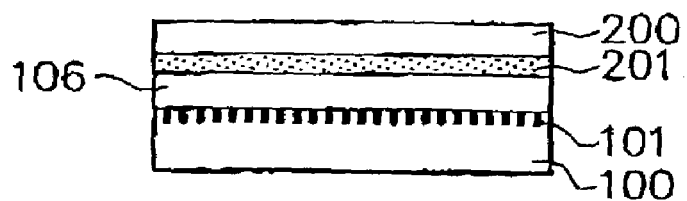
FIGS. 2(a) through 2(d) are schematic diagrams for explaining an embodiment when the production process of the present invention is applied to produce a SOI wafer having high thermal conductivity.

As shown in FIG. 2(a), the support substrate (comprising the molybdenum plate 200 whose surface is coated by the diamond layer 201) was laminated on the surface of the single crystal silicon layer 106 of the laminate (comprising the single crystal silicon substrate 100 having said single crystal silicon layer 106 formed on the porous layer 101 of said substrate 100) such that the surface of the diamond layer 201 of the support substrate was contacted with the surface of the single crystal silicon layer 106 of the laminate, followed by subjecting to a pressure bonding treatment, then followed by subjecting to an annealing treatment at 500° C., where the two members were strongly adhesive-bonded to each other by virtue of interatomic bonding formation. Thus, there was obtained a multi-layered body having such configuration as shown in FIG. 2(a).

Here, the reason why the molybdenum plate 200 whose surface is coated by the diamond layer 201 was used as the support substrate is grounded on the following factors. The thin diamond layer functions as an insulator having very high thermal conductivity. The molybdenum plate has relatively good thermal conductivity and the thermal expansion coefficient is relatively smaller than other metals. In the production of a SOI wafer, even when the support substrate is exposed to elevated temperature, it does not suffer troubles such as peeling, distortion and the like.

Figure 2B:
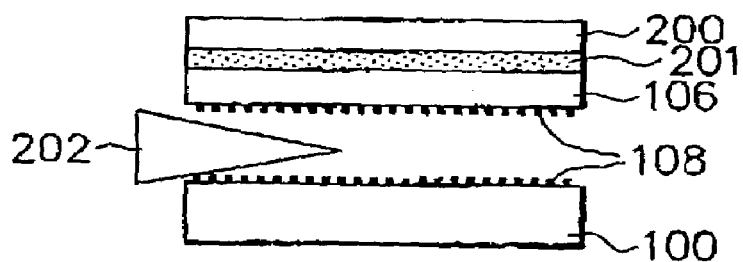

Now, after the above step, the multi-layered body was firmly vacuum-chucked onto the surface of a treatment stage such that the rear face of the single crystal silicon substrate 100 of the multi-layered body was faced to the surface of the treatment stage, where a wedge 202 was forcibly inserted into the porous layer 101 of the multi-layered body as shown in FIG. 2(b). As a result, the porous layer 101 was broken and a three-layered body comprising the single crystal silicon layer 106, the thin diamond layer 201 and the molybdenum plate 200 stacked in this order from the side of the single crystal silicon substrate 100 was peeled from the single crystal silicon substrate 100.

Because the peeled face of the single crystal silicon layer 106 of the three-layered body was found to have residues 108 of the porous layer 101 thereon [see, FIG. 2(b)], the porous layer residues 108 were etched off using an organic alkali solution in the same manner as in Example 1A. At this time, the alkali solution was prevented from being contacted with the molybdenum plate 200. After this, the three-layered body was rinsed with pure water in the same manner as in Example 1A, followed by being air-dried. Successively, the three-layered body was subjected to an annealing treatment using hydrogen gas in the same manner as in Example 1A.

Figure 2C:
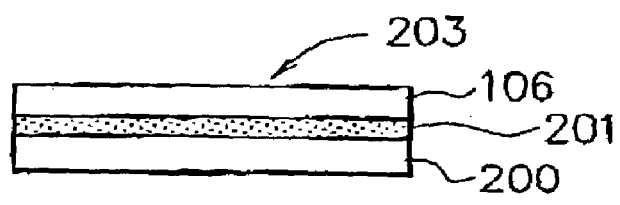

The single crystal silicon layer 106 of the three-layered body thus treated was examined by means of a microscope. As a result, it was found that the exposed surface of the single crystal silicon layer 106 of the three-layered body was uniformly flat and brilliant without having any defect. Thus, there was obtained a high quality SOI wafer 203 [see, FIG. 2(c)].

Figure 2D:
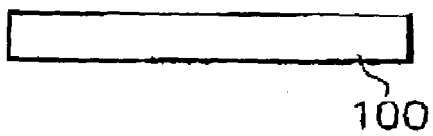

Separately, the single crystal silicon substrate 100 remained in the above was also found to have residues 108 of the porous layer 101 [see, FIG. 2(b)]. Therefore, as well as in the above, the single crystal silicon substrate 100 was subjected to the etching treatment to remove the porous layer residue 108, followed by subjecting to the hydrogen annealing treatment, whereby the opposite faces of the single crystal silicon substrate 100 were respectively uniformly flattened. Thus, there was obtained a resuscitated single crystal silicon substrate 100 as shown in FIG. 2(d).

The resuscitated single crystal silicon substrate 100 was recycled to the step of FIG. 1(a), where a porous layer 101 was formed on the surface of the resuscitated single crystal silicon substrate 100. Using this, the above described procedures were repeated to obtain a second SOI wafer.

EXAMPLE 3

This example describes an embodiment of the production process of the present invention when it is applied in the production of a solar cell having an active layer comprising an isotope-enriched silicon and a highly thermal-conductive member and which is suitable to operate under the sunlight optically concentrated at a high magnification.

In the following, description will be made with reference to FIGS. 1(a) through 1(c) and FIGS. 3(a) through 3(g).

1. Formation of Epitaxial Layer

In the step of FIG. 1(a), as the single crystal silicon substrate 100, there was provided a Cz single crystal silicon wafer shaped in a square form having a size of 5 cm×5 cm, fabricated from a starting silicon in which no silicon isotope is concentrated, composed of three kinds of stable silicon isotopes, namely, 92.3% $^{28}$Si, 4.7% $^{29}$Si, and 3.0% $^{30}$Si. This single crystal silicon wafer is of orientation (111). The resistivity of this single crystal silicon wafer was found to be 0.2 Ωcm.

On the surface of the single crystal silicon substrate 100, there was formed a porous layer 101 by the anodizing method. The anodizing conditions were essentially the same as those in Example 1A. That is, in a mixed solution obtained by mixing hydrofluoric acid and isopropyl alcohol at a mixing ratio of 1:1, the single crystal silicon substrate 100 and a platinum electrode plate were immersed such that they were opposed to each other while having an interval of 5 cm between them. Then, the single crystal silicon substrate 100 was made to serve as a positive electrode, and a direct current voltage was applied thereto. Particularly, electric current of 0.5 A was flown between the two electrode for the beginning 10 minutes, followed by flowing electric current of 1.25 A for 2 minutes. By this operation, a porous layer 101 comprising a first porous layer region provided with a number of pores having a relatively small size which extends from the surface of the single crystal silicon substrate 100 to a 10 μm depth thereof and a successive second porous layer region provided with a number of pores having a relatively large size which follows the first porous layer region was formed. In this way, the single crystal silicon substrate 100 was made have the porous layer 101 thereon.

The rear face and the circumference of the single crystal silicon substrate 100 were covered by a masking member made of quartz glass in order to prevent silicon from being grown on these areas.

Successively, as shown in FIG. 1(b), in accordance with the same manner in Example 1A, a melt 103 of 900° C. was produced in the crucible. Then, 10.0 g of pellets of silicon enriched in silicon isotope having mass number of 28 to 98.3% was dissolved in the melt 103, followed by being saturated. At this time, the melt 103 was agitated by means of the agitation means 105.

After this, the temperature of the melt 103 was gradually decreased, and when the temperature of the melt became to be 890° C., as shown in FIG. 1(c), the foregoing single crystal silicon substrate 100 having the porous layer 101 thereon was immersed in the melt 103. While maintaining this state, the temperature of the melt 103 was gradually decreased, and when the temperature of the melt 103 became to be 800° C., the single crystal silicon substrate 100 was pulled up and taken out to the outside.

The masking member was removed from the single crystal silicon substrate 100, and the single crystal silicon substrate 100 was examined. As a result, it was found that a single crystal silicon layer 106 was beautifully grown only on the surface of the porous layer 101 without the melt 103 being adhered on the single crystal silicon substrate 100. It was also found that the melt 103 was not adhered on the surface of the masking member.

Separately, it was found that the weight of the single crystal silicon substrate 100 after the liquid-phase epitaxy was increased by 0.27 g in comparison with that before the liquid-phase epitaxy. This means that 0.27 g of the silicon in the melt was grown on the single crystal silicon substrate 100 in the liquid-phase epitaxy.

In addition, the grown single crystal silicon layer 106 was examined. As a result, it was found that the single crystal silicon layer 106 was enriched in silicon isotope having a mass number of 28 to 98.3%.

2. Production of Solar Cell.

Figure 3A:
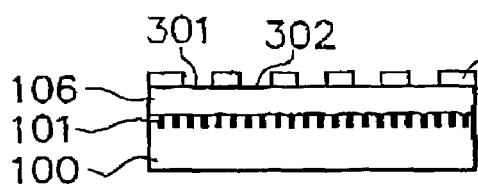
Figure 3B:
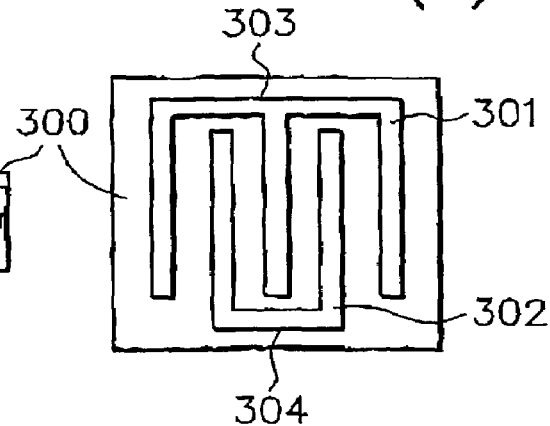

As shown in FIG. 3(a), a silicon oxide layer 300 having a thickness of 0.5 μm was formed on the surface of the single crystal silicon layer 106 obtained in the above 1 by way of thermal oxidation. Successively, two pectinate throughholes of 40 μm in width and 100 μm in pitch were formed at the silicon oxide layer 300 by means of the standard photolithography process. One of the two throughholes corresponds to the throughhole 301 for p-type electrode and the other corresponds to the throughhole 302 for n-type electrode in FIG. 3(a). In order to clarify the shapes of the two throughholes 301 and 302, in FIG. 3(b), there is shown a plan view of FIG. 3(a).

Figure 3C:
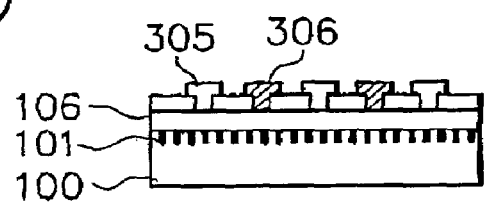

Successively, as shown in FIG. 3(c), a pattern of a boron-containing silver paste was printed so as to fit to the throughhole 301 for p-type electrode, and a pattern 306 of a phosphorus-containing silver paste was printed so as to fit the throughhole 302 for n-type electrode.

Thereafter, the patterns 305 and 306 were baked. At that time, the boron was diffused just below the p-type electrode pattern 305, where a $p^+$-type diffusion region in the single crystal silicon layer 106, and the phosphorus was diffused just below the n-type electrode pattern 306, where an $n^+$-type diffusion region was formed in the single crystal silicon layer 106, whereby semiconductor junctions were formed.

After the electrode patterns 305 and 306 were formed in this way, a pair of tubs for outputting electric current (not shown in the figure) were fixed respectively to a position 303 and a position 304 shown in 3(b).

Figure 3D:
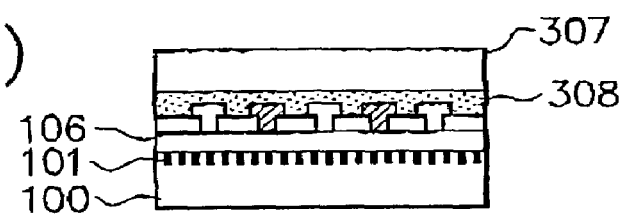

Then, as shown in FIG. 3(d), from above the single crystal silicon layer 106 in which the electrode patterns and the tubs were provided, a copper plate 307 was affixed through an epoxy adhesive 308. At that time, the two tubs were projected respectively from the copper plate 307 so that electric current can be outputted through the tubs.

Figure 3E:
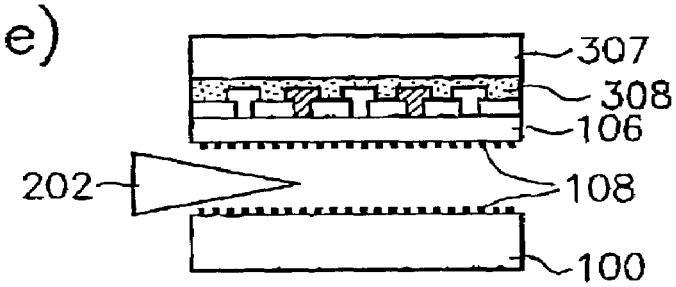

Thereafter, the copper plate 307 side was firmly vacuum-chucked onto the surface of a treatment stage, where a wedge 202 was forcibly inserted into the porous layer 101 as shown in FIG. 3(e). As a result, the porous layer 101 was broken and the single crystal silicon substrate 100 was peeled from the single crystal silicon layer 106 having the copper plate 307 affixed thereto.

Figure 3F:
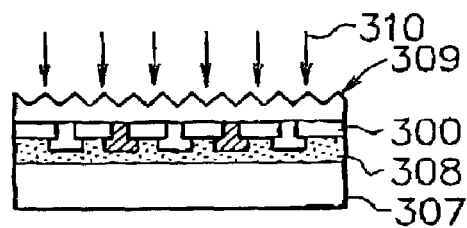

Then, as shown in FIG. 3(f), by way of the standard photolithography process, residues 108 of the porous layer 101 remained the peeled face of the single crystal silicon layer 106 were removed and together with this, a number of textures 309 respectively shaped in a square pyramid form having a size of 2 μm×2 μm at the surface of the single crystal silicon layer.

Thus, there was produced an optical-concentration type solar cell having the active layer (comprising the single crystal silicon layer) having a thickness of 50 μm supported by the copper plate. Here, reference numeral 310 in FIG. 3(f) indicates the sunlight.

In this solar cell, the electrodes are formed on the rear side of the solar cell, viewed from the light-receiving face side. Therefore, incident light is never obstructed by the electrodes, and this allows large photoelectric current to be flown.

Figure 3G:
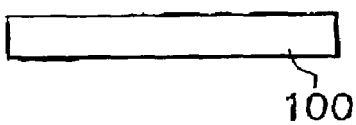

Separately, the single crystal silicon substrate 100 remained in the above was also found to have residues 108 of the porous layer 101 [see, FIG. 3(e)]. Therefore, as well as in Example 1A, the single crystal silicon substrate 100 was subjected to the etching treatment by means of the organic alkali solution to remove the porous layer residues 108, followed by subjecting to the hydrogen annealing treatment, whereby the opposite faces of the single crystal silicon substrate 100 were respectively uniformly flattened. Thus, there was obtained a resuscitated single crystal silicon substrate 100 as shown in FIG. 3(g).

The resuscitated single crystal silicon substrate 100 was recycled to the step of FIG. 1(a), where a porous layer 101 was formed on the surface of the resuscitated single crystal silicon substrate 100.

Separately, the melt 103 in the crucible 102 [see, FIG. 1(b)] whose silicon concentration had been reduced due to the first liquid-phase epitaxy was again heated to 900° C., and pellets of silicon enriched in silicon isotope having mass number of 28 to 98.3% were put in the melt, where at the time when 0.27 g of the silicon pellets was dissolved, the melt was saturated. This means that the amount of the silicon consumed in the first liquid-phase epitaxy and the amount of the silicon grown on the substrate are the same. Thus, it can be said that the starting isotope-concentrated silicon was not wasted in this example.

Comparative Example 2

In this comparative example, the procedures of Example 3 were repeated, except for the following point, to obtain an optical-concentration type solar cell That is, instead of the pellets of silicon enriched in silicon isotope having mass number of 28 to 98.3% used in Example 3 as the starting silicon, pellets of ordinary silicon in which no silicon isotope is concentrated, specifically, consisting of three kinds of stable silicon isotopes (92.2% $^{28}$Si, 4.7% $^{29}$Si, and 3.1% $^{30}$Si), were used.

Evaluation

The optical-concentration type solar cell obtained in Example 3 and the optical-concentration type solar cell obtained in Comparative Example 2 were evaluated with respect to their photoelectric conversion efficiency. That is, after each solar cell was cooled by water-cooling from the copper plate side thereof, the photoelectric conversion efficiency thereof was measured. And the photoelectric conversion efficiency of the solar cell obtained in Example 3 was compared with that of the solar cell obtained in Comparative Example 2.

That is, under the standard light irradiation condition (AM 1.5), the photoelectric conversion efficiency of each of the two solar cells was 22.0%. However, under the optical light concentration condition at a magnification of 200 times, the photoelectric conversion efficiency of the solar cell of Example 3 was 26.0%, which was good enough. However, the photoelectric conversion efficiency of the solar cell of Comparative Example 2 was 23.0%, where the increase rate of the photoelectric conversion efficiency due to the optical light concentration was inferior. For the reason for this, it is considered such that, the isotope-concentrated silicon whose thermal conductivity is good was used in the active layer of the solar cell of Example 3.

As being apparent from the above description, according to the present invention, it is possible to efficiently produce a thin single crystal silicon wafer having a necessary and minimum which makes it possible to produce a high performance semiconductor device, by efficiently using a starting silicon enriched in silicon isotope having a mass number of 28 to a high concentration which is costly but has high thermal conductivity substantially without causing waste. And it is also possible to efficiently produce a high performance semiconductor device by using said thin single crystal silicon wafer, which is satisfactory in terms of the characteristics and also in terms of the cooling efficiency, at a markedly reduced production cost. Further, in the case where said thin single crystal silicon wafer is used in the production of a microprocessor which operates with a high operating frequency which brings about heat generation or an optical-concentration type solar cell which is exposed to strong radiation heat and therefore is likely to be heated to high temperature, it is possible to efficiently produce a desirable microprocessor or a desirable optical-concentration type solar cell, which has an improved performance which is hardly deteriorated even under severe condition.

What is claimed is:

1. A process for producing a single crystal silicon wafer comprising a silicon enriched in silicon isotope whose mass number is 28 to an average concentration of more than 98%, said process comprising:
    a step (i) wherein a porous layer is formed on a single crystal silicon substrate comprising a silicon whose concentration of mass number 28 silicon isotope is less than 92.5% on an average;
    a step (ii) wherein a starting silicon whose concentration of mass number 28 silicon isotope is more than 98% on an average is dissolved in a melt for liquid-phase epitaxy by supplying a gas containing said starting silicon to said melt until said starting silicon is in a supersaturated state in said melt under reductive atmosphere maintained at high temperature;
    a step (iii) wherein said single crystal silicon substrate is immersed in said melt to grow a single crystal silicon layer on the surface of said porous layer of said single crystal silicon substrate; and
    a step (iv) wherein said single crystal silicon layer grown on said porous layer of said single crystal silicon substrate in said step (iii) is made to be as a wafer and said wafer is peeled from a portion of said porous layer.

2. The process according to claim 1, wherein as the single crystal silicon substrate used in the step (i) for forming the porous layer on said single crystal silicon substrate, a single crystal silicon substrate whose orientation is (111) is used.

3. The process according to claim 1, wherein the single crystal silicon substrate used in the step (i) for forming the porous layer on said single crystal silicon substrate has a shape in a rectangular form.

4. The process according to claim 1, wherein instead of the starting silicon dissolved in the melt in the step (ii), a gaseous silicon compound whose concentration of mass number 28 silicon isotope is more than 98% on an average is dissolved in the melt.

5. The process according to claim 1, wherein in the step (iii) wherein the single crystal silicon layer is grown on the surface of the porous layer of the single crystal silicon substrate, said single crystal silicon layer is grown at a thickness of less than 100 μm on the surface of said porous layer.

6. The process according to claim 1, wherein said process a step wherein at least a semiconductor junction is formed at the single crystal silicon layer grown on the surface of the porous layer between the step (iii) and the step (iv).

7. The process according to claim 1, wherein said process has a step wherein a silicon oxide layer is at least formed on the surface of the single crystal silicon layer grown on the surface of the porous layer between the step (iii) and the step (iv).

8. The process according to claim 1, wherein in step (iv), to peel the single crystal silicon layer from the portion of the porous layer of the single crystal silicon substrate is performed by laminating a substrate on the surface of the single crystal silicon layer and working a force between said substrate laminated on the single crystal silicon layer and the single crystal silicon substrate.

9. The process according to claim 1, wherein in step (iv), to peel the single crystal silicon layer from the portion of the porous layer of the single crystal silicon substrate is performed by rapidly affording a temperature gradient between the surface of the single crystal silicon layer and the rear face of the single crystal silicon substrate and peeling the single crystal silicon layer is peeled from the portion of the porous layer by virtue of a shearing force provided due to a difference between thermal expansion magnitude of the single crystal silicon layer and that of the single crystal silicon substrate.

10. The process according to claim 1, wherein said process has, after the step (iv) wherein the single crystal silicon layer is peeled from the portion of the porous layer, a step of flattening the surface of the single crystal silicon substrate and recycling said surface-fattened single crystal silicon substrate.

* * * * *

UNITED STATES PATENT AND TRADEMARK OFFICE
CERTIFICATE OF CORRECTION

| | | |
|---|---|---|
| PATENT NO. | : 7,077,901 B2 | |
| APPLICATION NO. | : 10/402214 | |
| DATED | : July 18, 2006 | |
| INVENTOR(S) | : Katsumi Nakagawa et al. | |

It is certified that error appears in the above-identified patent and that said Letters Patent is hereby corrected as shown below:

ON THE TITLE PAGE [56] REFERENCES CITED:

Other Publications, "Plank" should read --Planck--.

ON THE TITLE PAGE [ABSTRACT]:

Line 6, "silicone" should read --silicon--.

COLUMN 1:

Line 31, "this not" should read --this is not--;
Line 38, "a as" should read --as a--;
Line 52, "inclreased." should read --increased.--; and
Line 60, "systems," should read --system,--.

COLUMN 2:

Line 9, "microprocessors," should read --microprocessor,--; and
Line 32, "Plank" should read --Planck--.

COLUMN 6:

Line 3, "2(g)" should read --3(g)--;
Line 54, "refrained from using" should read --not been used--; and
Line 61, "et als.," should read --et al.,--.

COLUMN 7:

Line 21, "an" should read --a--;
Line 28, "appeared." should read --apparent--;
Line 47, "is desirably occurred" should read --desirably occurs--; and
Line 58, "do in this ways" should read --do it in this way--.

COLUMN 9:

Line 42, "silicone" should read --silicon--;
Line 43, "water" should rear --wafer--; and
Line 52, "product" should read --product.--.

UNITED STATES PATENT AND TRADEMARK OFFICE
CERTIFICATE OF CORRECTION

| | |
|---|---|
| PATENT NO. | : 7,077,901 B2 |
| APPLICATION NO. | : 10/402214 |
| DATED | : July 18, 2006 |
| INVENTOR(S) | : Katsumi Nakagawa et al. |

It is certified that error appears in the above-identified patent and that said Letters Patent is hereby corrected as shown below:

COLUMN 10:

Line 24, "electrode" should read --electrodes--; and
    Line 33, "made have" should read --made to have--.

COLUMN 11:

Line 47, "became" should read --came--; and
    Line 66, "an" should read --a--.

COLUMN 12:

Line 36, "Thus" should read --Thus,--.

COLUMN 15:

Line 12, "electrode" should read --electrodes--; and
    Line 22, "made have" should read --made to have--.

COLUMN 16:

Line 15, "region in" should read --region was formed in--; and
    Line 41, "remained" should read --remaining on--.

COLUMN 17:

Lines 56 and 57, "having a necessary and minimum" should be deleted.

COLUMN 18:

Line 55, "a step" should read --has a step--.

COLUMN 19:

Line 10, "is peeled" should be deleted.

UNITED STATES PATENT AND TRADEMARK OFFICE
CERTIFICATE OF CORRECTION

PATENT NO. : 7,077,901 B2
APPLICATION NO. : 10/402214
DATED : July 18, 2006
INVENTOR(S) : Katsumi Nakagawa et al.

It is certified that error appears in the above-identified patent and that said Letters Patent is hereby corrected as shown below:

COLUMN 20:

Line 8, "surface-fattened" should read --surface-flattened--.

Signed and Sealed this

Twenty-fifth Day of March, 2008

JON W. DUDAS
*Director of the United States Patent and Trademark Office*